United States Patent
Teranishi (10) Patent No.: US 10,033,161 B2
(45) Date of Patent: Jul. 24, 2018

(54) OPTICAL AMPLIFYING UNIT COMPRISING A SEMICONDUCTOR OPTICAL AMPLIFIER AND A VARIABLE OPTICAL ATTENUATOR AND METHOD TO CONTROL THE SAME

(71) Applicant: Sumitomo Electric Device Innovations, Inc., Yokohama-shi (JP)

(72) Inventor: Ryota Teranishi, Yokohama (JP)

(73) Assignee: Sumitomo Electric Device Innovations, Inc., Yokohama-shi (JP)

(*) Notice: Subject to any disclaimer, the term of this patent is extended or adjusted under 35 U.S.C. 154(b) by 70 days.

(21) Appl. No.: 14/850,698

(22) Filed: Sep. 10, 2015

(65) Prior Publication Data

US 2016/0079730 A1    Mar. 17, 2016

(30) Foreign Application Priority Data

Sep. 11, 2014    (JP) ................................. 2014-185303

(51) Int. Cl.
    *H01S 5/50*         (2006.01)
    *H04B 10/291*     (2013.01)
                    (Continued)

(52) U.S. Cl.
CPC .............. *H01S 5/50* (2013.01); *H01S 5/0265* (2013.01); *H01S 5/0683* (2013.01); *H04B 10/2914* (2013.01); *H01S 5/0014* (2013.01); *H01S 5/02216* (2013.01); *H01S 5/02284* (2013.01); *H01S 5/02415* (2013.01); *H01S 2301/06* (2013.01)

(58) Field of Classification Search
CPC ........ H01S 5/50; H01S 5/0265; H01S 5/0683; H01S 5/02216; H01S 5/02284; H01S 2301/06; H01S 5/02415; H01S 5/0014; H01S 5/062; H04B 10/2914; G01J 2001/4242

See application file for complete search history.

(56) References Cited

U.S. PATENT DOCUMENTS 6,275,329 B1 * 8/2001 Sieben ................ H01S 3/06754
                                           359/337.13
7,095,938 B2 * 8/2006 Tolstikhin .......... G02B 6/12004
                                            257/E31.061

(Continued)

FOREIGN PATENT DOCUMENTS

| CN | 101043758 A | 9/2007 |
| JP | 08-248455 A | 9/1996 |
| JP | H09-224016 A | 8/1997 |

OTHER PUBLICATIONS

Non-Final Office Action in U.S. Appl. No. 15/007,393, dated Dec. 22, 2017.

*Primary Examiner* — Tony Ko
*Assistant Examiner* — Jennifer Bennett
(74) *Attorney, Agent, or Firm* — Venable LLP; Michael A. Sartori; Laura G. Remus (57) ABSTRACT

An optical amplifying apparatus and a method to control the same are disclosed. The apparatus includes a semiconductor device that integrates a variable optical attenuator (VOA) with a semiconductor optical amplifier (SOA). The VOA evaluates the optical power of an incident beam from a photocurrent generated therein. The attenuation of the VOA and the optical gain by the SOA are optionally determined based on the detected input power.

7 Claims, 8 Drawing Sheets

(51) Int. Cl.
  *H01S 5/0683* (2006.01)
  *H01S 5/026* (2006.01)
  *H01S 5/022* (2006.01)
  *H01S 5/024* (2006.01)
  *H01S 5/00* (2006.01)

(56) References Cited

U.S. PATENT DOCUMENTS

| | | |
|---|---|---|
| 2003/0081893 A1 | 5/2003 | Wing So |
| 2004/0190846 A1 | 9/2004 | Nakamura et al. |
| 2005/0006654 A1 | 1/2005 | Kang et al. |
| 2005/0025414 A1* | 2/2005 | Kamiyama ............ H01S 5/026 385/27 |
| 2006/0093362 A1* | 5/2006 | Welch ................ G02B 6/12004 398/87 |
| 2008/0181612 A1 | 7/2008 | Mills et al. |
| 2009/0302947 A1 | 12/2009 | Oishi |
| 2009/0324257 A1* | 12/2009 | Murakami ......... H04B 10/2916 398/200 |
| 2012/0148239 A1 | 6/2012 | Mori et al. |

\* cited by examiner

OPTICAL AMPLIFYING UNIT COMPRISING A SEMICONDUCTOR OPTICAL AMPLIFIER AND A VARIABLE OPTICAL ATTENUATOR AND METHOD TO CONTROL THE SAME

BACKGROUND OF THE INVENTION

1. Field of the Invention

The present application relates to an optical amplifying unit and a method to control the optical amplifying unit.

2. Background Arts

An optical communication system often installs optical amplifying units each implementing a semiconductor optical amplifier (SOA) between an optical transmitter and an optical receiver. Such an optical amplifying unit first detects power of an incident optical beam, then, amplifies the incident optical beam such that power of an output beam is maintained in constant, which is often called as the automatic power control (APC). Because the incident optical beam entering the amplifying unit shows various optical power depending on types of optical transmitters, optical losses in transmission lines, and so on. Accordingly, the amplifying unit often attenuates the power of the incident optical beam, then, amplifies the attenuated beam.

Japanese Patent laid open No. H09-224016A has disclosed an optical amplifying unit that provides optical attenuators to attenuate incident beams each coming from optical transmitters, an optical multiplexer to multiplex attenuated optical beams, and an optical amplifier to amplify the multiplexed optical beam. The amplifying unit disclosed therein feeds the power of the output beam output from the optical amplifier back to the optical attenuators but does not detect the power of the incident beams. When an amplifying unit provides a photodetector to sense power of the incident beam to operate the optical amplifier set in downstream of the attenuator, the amplifying unit inherently becomes complex and enlarges a size thereof. In particular, when the amplifying unit receives a plurality of incident beams like that disclosed in the prior art, the number of the photodetectors set in the front end of the attenuator becomes large and the amplifying unit becomes further complex.

SUMMARY OF THE INVENTION

One aspect of the present application relates to an optical apparatus that comprises a semiconductor device and a controller. The semiconductor device integrates a semiconductor optical amplifier (SOA) with a variable optical attenuator (VOA) primarily made of semiconductor materials. The controller first calculates input power of the incident optical beam entering the VOA through a photocurrent generated in the VOA, then, provides a bias to the VOA to attenuate the incident optical beam and a bias current to the SOA to show an optical gain in the SOA each depending on the input power.

Another aspect of the present application relates to a method to control the optical amplifying unit that implements a semiconductor device and a controller. The semiconductor device integrates the SOA with the VOA. The method includes steps of: (a) supplying a first bias to the VOA; (b) inputting an incident optical beam to the VOA; (c) calculating input power of the incident beam through a photocurrent generating in the VOA; (d) supplying a second bias to the VOA, where the second bias depends on the input power and adequately attenuates the incident optical beam; and (e) supplying a bias current to the SOA, where the bias current depends on the input power and adequately sets an optical gain in the SOA.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments of the present application will be described as referring to drawings. In the description of the drawings, numerals or symbols same with or similar to each other will refer to elements same with or similar to each other without duplicating explanations.

Figure 1:
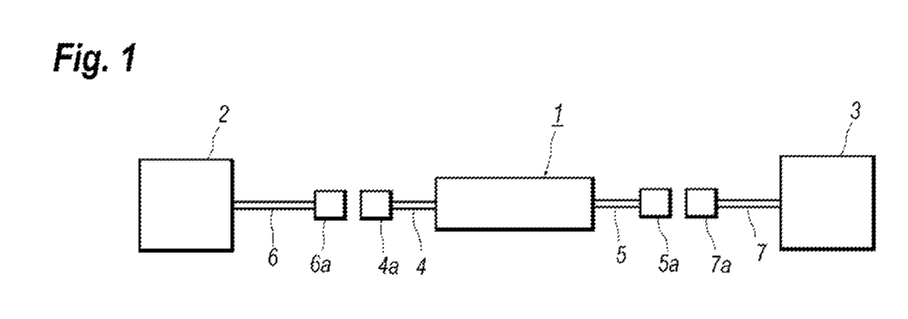
FIG. 1 schematically shows an example of an optical system that implements an optical amplifying unit of the present application.

FIG. 1 schematically illustrates an example of an application of an optical amplifying unit 1 according to the first embodiment. The optical amplifying unit 1, which is put between an optical transmitter 2 and an optical receiver 3, provides an optical fiber 4 accompanying with an optical connector 4a and another optical fiber 5 with another optical connector 5a. The former optical connector 4a is to be mated with an optical connector 6a attached to an optical fiber coupled with the optical transmitter 2, while, the latter optical connector 5a is to be mated with an optical connector 7 attached to an optical fiber 7 extending from the optical receiver 3. The optical amplifying unit 1 may receive an optical signal provided from the optical transmitter 2 through the optical fibers, 4 and 6, and provide amplified optical signal to the optical receiver 3 through the optical fibers, 5 and 7.

Figure 2:
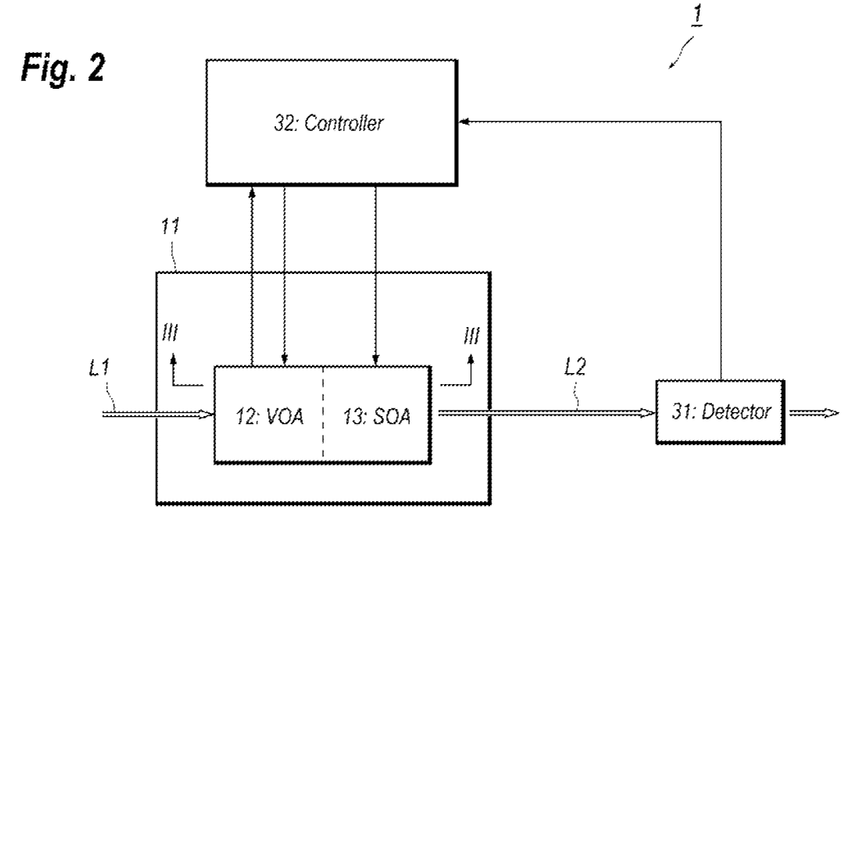
FIG. 2 is a schematic block diagram of an optical amplifying unit according to an embodiment of the present invention.

FIG. 2 schematically shows a functional block diagram of the optical amplifying unit 1. The optical amplifying unit 1 includes a semiconductor device 11 that integrates a semiconductor optical amplifier (SOA) 13 with a variable optical attenuator 12. The incident optical beam L1, which comes from the optical transmitter 2, enters the VOA 12, while, the SOA 13 outputs an amplified beam L2 to the optical receiver 3.

Figure 3:
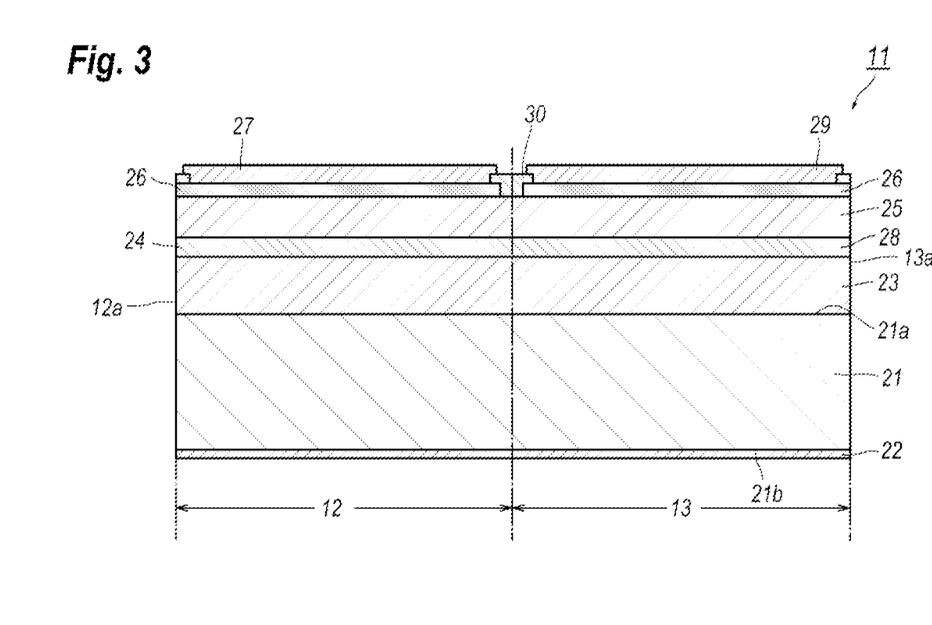
FIG. 3 shows a cross section taken along the line III-III indicated in FIG. 2.

FIG. 3 shows a cross section of the semiconductor device 11 taken along the line III-III indicated in FIG. 2. A semiconductor substrate 21 commonly and monolithically mounts the VOA 12 and the SOA 13 on a primary surface 21a thereof, which may form the semiconductor device 11 in further compact. The semiconductor substrate 11 may be made of InP whose back surface 21b opposite to the primary surface 21a provides a back electrode 22.

The VOA 12 includes, on the semiconductor substrate 21, a semiconductor stack of a lower cladding layer 23, an attenuating layer 24, an upper cladding layer 25, and a contact layer 26. The contact layer 26 provides an electrode 27 thereon. The lower cladding layer 23 may be made of n-type InP. The attenuating layer 24 may include a multiple quantum well (MQW) structure including InGaAsP. The attenuation layer 24 varies absorption co-efficient thereof depending on an electric field induced therein. Specifically, when the VOA 12 is negatively biased, that is, the top electrode 27 receives a negative voltage with respect to the back electrode 22, a strong electric filed is induced in the attenuation layer 24, which modify the energy bandgap thereof and varies the absorption co-efficient thereof. Accordingly, the VOA 12 may show a function of the variable optical attenuation depending on the bias applied to the top electrode 27. The upper cladding layer 25 may be made of p-type InP. The contact layer may be made of InGaAsP.

The SOA 13 includes, also on the semiconductor substrate 21, the lower cladding layer 23, an amplifying layer 28, the upper cladding layer 25, the contact layer 27, and an electrode 29. The amplifying layer 28 may have the MQW structure including InGaAsP. The contact layer 29 in the SOA 13 is physically isolated from the contact layer 27 of the VOA 12 by interposing a passivation layer 30 therebetween. The passivation layer 30 may be made of insulating material including silicon oxide.

An optical detector 31 shown in FIG. 2, which may detect the optical power of the amplified beam L2, may include a photodiode.

A controller 32 also shown in FIG. 2 controls the VOA 12 and the SOA 13. For instance, the controller 32, when the incident optical beam L1 enters the VOA 12, detects a photocurrent generated in the VOA 12 and calculates the optical power of the incident beam L1 from a magnitude of the photocurrent. Based on thus calculated power of the incident beam L1, the controller 32 controls the attenuation by the VOA 12 and the optical gain in the SOA 13. The photocurrent generated in the VOA 12 may be detected through a current detector implemented within the controller 32, or set outside of the controller 32. The controller 32 also controls the optical gain in the SOA 13 by, for instance, adjusting a bias current supplied to the SOA 12. The controller 32 may control the SOA 13 by feeding the optical power of the amplified beam L2 detected by the optical detector 31 back to the bias current. The optical amplifying unit 1 may include the controller 32 and/or the optical detector 31.

Figure 4:
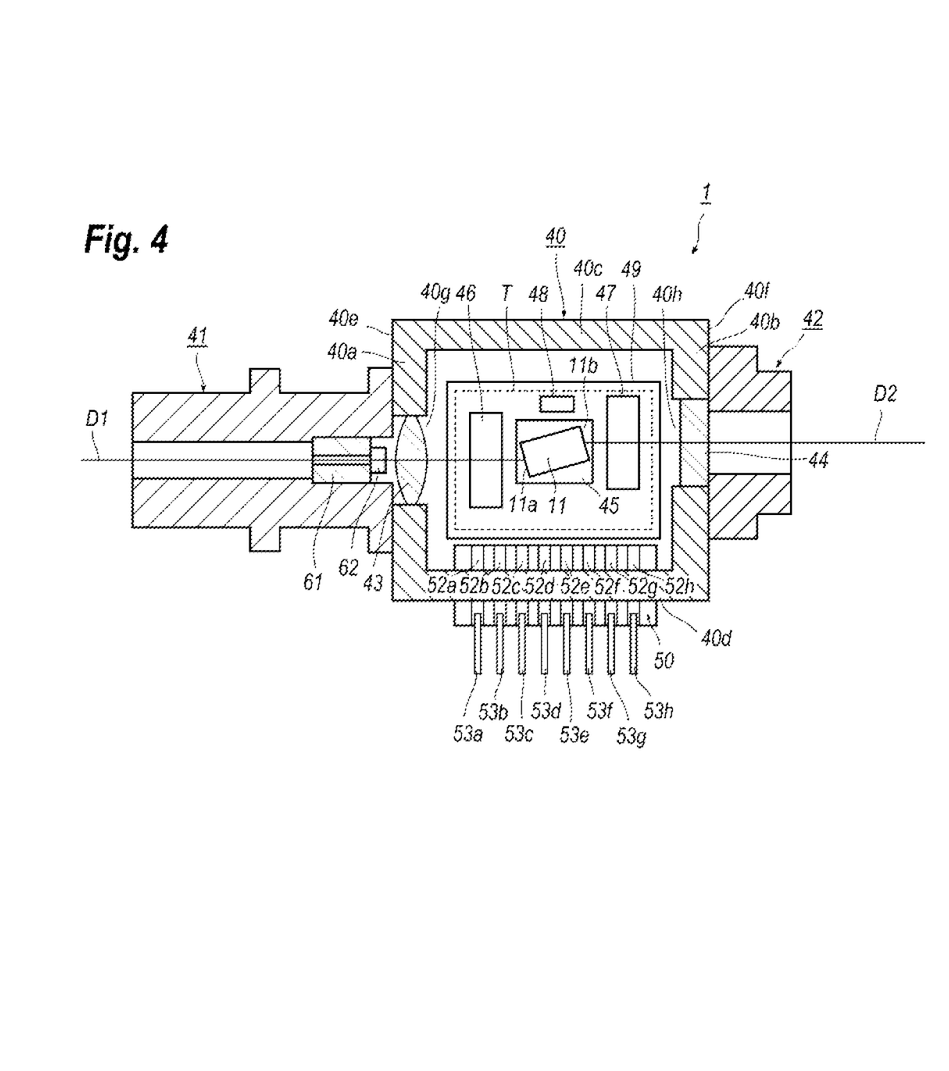
FIG. 4 is a horizontal sectional view of the optical amplifying unit of the present application.

Next, details of the optical amplifying unit 1 will be described as referring to FIG. 4 which is a plan view of the optical amplifying unit 1. The optical amplifying unit 1 includes a housing 40 that encloses the semiconductor device 11, a front coupling unit 43, and a rear coupling unit 42.

The housing 40, which has a box shape including sides, 40a and 40b, opposite to each other, and other sides, 40c and 40d, also opposite to each other and extending in perpendicular to the former two sides, 40a and 40b. Thus, four sides, 40a to 40d, form the box shape housing 40. Although not illustrated in FIG. 4, the housing 40 further provides a bottom and a ceiling. The housing 40 except for the bottom may be made of, for instance, alloy containing iron (Fe), nickel (Ni), and cobalt (Co), which is often called as Kovar.

The bottom may be made of alloy containing tungsten (W), for instance, copper-tungsten (CuW). The side 40a includes a front surface 40e to which the front coupling portion 41 is assembled. The side 40a also provides a front opening 40g into which a front lens 43 is fitted. The front optical axis D1 extending from the semiconductor device 11 passes the front lens 43 in the front opening 40g. The rear side 40b includes a rear surface 40f that provides a rear opening 40h into which a window 44 made of silica glass is fitted. The rear optical axis D2 extending from the semiconductor device 11 passes the window 44 in the rear opening 40h.

The housing 40 installs, in addition to the semiconductor device 11, a sub-carrier 45, collimating lenses, 46 and 47, a thermistor 49, and a thermo-electric cooler (TEC) T. The TEC T mounts the sub-carrier 45, on which the semiconductor device 11 is mounted, the front and rear collimating lenses, 46 and 47, and the thermistor 48 through the carrier 49.

The semiconductor device 11 provides a front facet 11a, which corresponds to a facet 12a of the VOA 12, and a rear facet 11b, which corresponds to a facet 13a of the SOA 13. The front facet 11a optically couples with the front coupling portion 41 through the front collimating lens 46 and the front lens 43, while, the rear facet 11b optically couples with the rear coupling portion 42 through the rear collimating lens 47. The semiconductor device 11 in the optical axis thereof makes a substantial angle with respect to the front optical axis D1 and the rear optical axis D2 to suppress light reflected at the front facet 11a from returning the front coupling portion 41 and light output from the rear facet 11b of the semiconductor device 11 from retuning the semiconductor device 11.

The sub-carrier 45, which mounts the semiconductor device 11, may be made of, for instance, aluminum nitride (AlN). The carrier 49 mounts the sub-carrier 45, the front and rear collimating lenses, 46 and 47, and the thermistor 48. The TEC T may be a Peltier device. The thermistor 48 may indirectly sense a temperature of the semiconductor device 11 through a temperature of a top of the carrier 49. Accordingly, the thermistor 48 is preferably positioned as close as possible to the semiconductor device 11.

The side 40d provides a terminal 50 on which a plurality of interconnections, 52a to 52h, are formed. The interconnections, 52a to 52h, are electrically connected to the TEC T, the semiconductor device 11, and the thermistor 48. The terminal 50 also provides a plurality of lead pins, 53a to 53h, each connected to the interconnections, 52a to 52h. Referring to FIG. 2, some of the lead pins, 53a to 53h, carry control signals for the SOA 13 and the VOA 12, a sensed signal from the VOA 12. The terminal 50 may be made of ceramics, while, the interconnections, 52a to 52h, may be made of metal primarily containing gold (Au).

The front coupling portion 41, which may be made of stainless steel and welded to the front surface 40e of the housing 40, passes the front optical axis D1 therein. The front coupling portion 41 may be an optical receptacle to receive an optical ferrule attached in a tip of an external optical fiber with which the semiconductor device 11 optically couples. The front coupling portion 41 includes a stub 61 and an optical isolator 62. The stub 61 includes a coupling fiber in a center thereof, where the coupling fiber is to be optically coupled with the external optical fiber by abutting the end of the optical ferrule against an end of the stub, which realizes the physical contact between the external fiber and the coupling fiber. The optical isolator 62, which is attached to another end of the stub 61, transmits light going to the semiconductor device 11 but prevents light coming from the semiconductor device 11 from radiating externally. The stub 61 may be made of ceramics.

The rear coupling portion 42, which is a cylindrical shape with a center coinciding with the rear optical axis D2, is welded to the rear surface 40f of the housing 40. Although not illustrated in FIG. 4, the rear coupling portion 42 in another end thereof is to be assembled with an external optical apparatus such as an optical receiver. The rear coupling portion 42 passes the rear optical axis D2 extending from the rear facet 11b of the semiconductor device 11.

Next, a method to control the optical amplifying unit 1 will be described as referring to FIG. 5 which is a flowchart of the method to control the optical amplifying unit 1.

The method first supplies a bias V1 to the VOA 12 from the controller 32, at step S1. The first bias V1 in a magnitude thereof is optional as far as the bias V1 is negative. That is, referring to FIG. 3, the bias V1 biases the top electrode 27 in negative with respect to the back electrode 22. Under such a condition, the SOA 13 may be preferably biased with no current. The first bias V1 applied to the electrode 27 may be zero, then, no optical noise is caused in the SOA 13.

Then, the incident optical beam L1 is practically input to the VOA 12 at step S2. Because the VOA 12 is negatively biased or zero biased, the VOA 12 may absorb a portion of the incident optical beam L1, that is, VOA 12 shows substantial attenuation.

Then, as the third step S3, the optical power Pin of the incident beam L1 is calculated from a photocurrent IM generated in the VOA 12. In an example, a table below may determine the magnitude of the incident beam from the photocurrent. The table below may be created by using a reference optical source which may definitely set optical power thereof. The controller 32 may hold the relation below as a memory look-up table.

| Pin (dBm) | IM (μA) |
|---|---|
| −20 | 1.0 |
| −15 | 3.2 |
| −10 | 10.0 |
| −5 | 31.6 |
| 0 | 100.0 |
| 5 | 316.2 |
| 10 | 1000.0 |

Next, as the fourth step S4, a practical bias V2 to optionally adjust the attenuation in the VOA 12 may be determined depending on the power of the incident optical beam L1 calculated from the photocurrent through the look-up-table. A table below correlates the attenuation with the input power. As shown in the table below, the attenuation in the VOA 12 is set relatively low when the optical power of the incident beam L1 is small, while, greater attenuation is set when the input optical power of the incident bema L1 becomes greater.

| Pin (dBm) | V2 (V) | VOA (dBm) |
|---|---|---|
| −20 | 0 | 0 |
| −15 | 0 | 0 |
| −10 | −1 | −5 |
| −5 | −2 | −8 |
| 0 | −3 | −12 |
| 5 | −4 | −15 |
| 10 | −5 | −20 |

Next, as the fifth step S5, the amplifying unit 1 practically amplifiers the attenuated beam output from the VOA 12 by supplying the bias current IS to the SOA 13. In the present embodiment, the SOA 13 is controlled such that the output beam L2 has constant amplified power of −5 dBm independent on the optical power of the incident beam L1. Two methods may be practical, one of which primarily controls the attenuation of the VOA 12 as setting the optical gain in the SOA 13 to be substantially constant, while, the other controls the optical gain in the SOA 13 as keeping the attenuation of the VOA in constant. Except for extrema conditions where the incident beam has power unable to attenuate to a value adequate for the SOA 13, or the incident beam L1 only has faint power unable to be amplified to a predetermined level even when the SOA 13 is set to show the maximum optical gain, an SOA is preferable to be operated under a state where the SOA shows a substantially optical gain. Accordingly, the controller 32 supplies a substantial bias current IS, by which the SOA shows a substantial optical gain.

Figure 6:
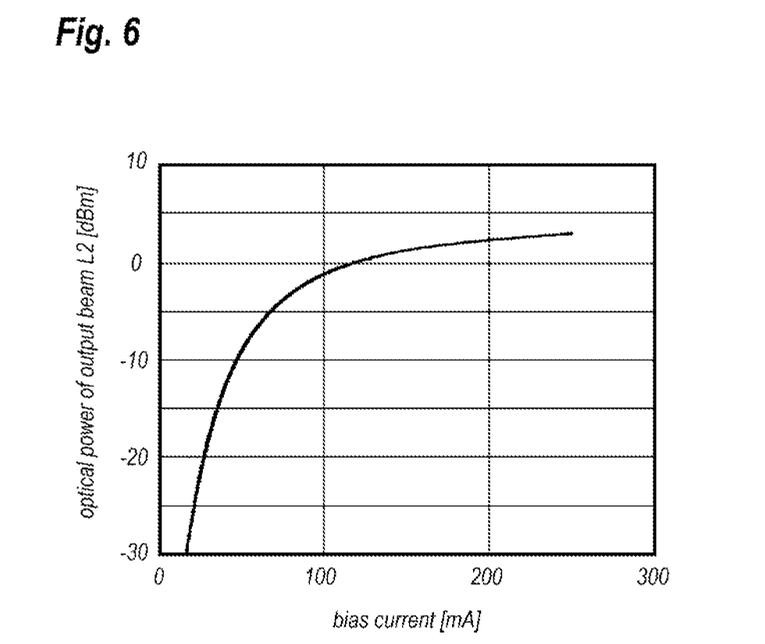
FIG. 6 shows an exemplary relation between the bias current supplied to an SOA and the optical gain realized in the SOA.

FIG. 6 shows optical power of the SOA 13 as varying the bias current IS thereof when the input power is set constant. Specifically, the power of the incident beam L1 is set constant in 0 dBm, and the VOA 12 is set in the attenuation thereof to be −12 dB, which means that optical power input to the SOA 13 is set in constant to be −12 dBm. The SOA 13 may operate as an optical absorber when the bias current IS is set smaller than mA, and saturates the optical gain thereof even when the bias current IS exceeds about 150 mA. Accordingly, the SOA 13 is most effectively operable when the bias current is set in a range of 50 to 130 mA.

Figure 7:
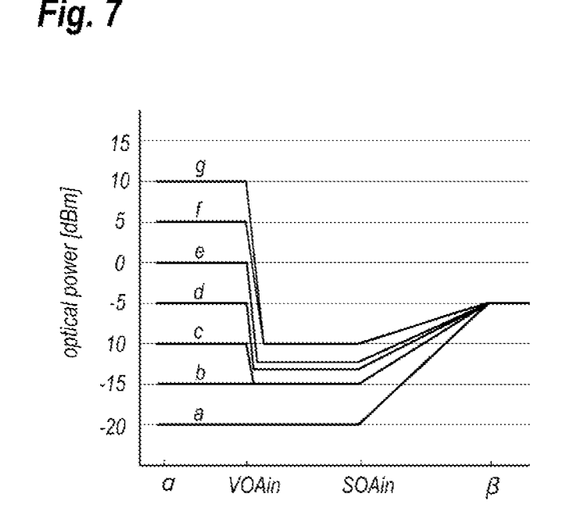
FIG. 7 shows an example of the changes of the optical power in the optical amplifying unit of the present invention for various incident power.

Table below lists exemplary cases, a to g, for the amplifying unit 1 of the present embodiment when the optical power of the incident beam is varied in a range from −20 to +10 dBm, and FIG. 7 shows behaviors of the optical power at respective units, where α, VOAin, SOAin, and β correspond to an optional position of the incident beam L1, the front facet 11a, a virtual boundary between the VOA 12 and the SOA 13, and the rear facet 12b of the semiconductor device 11, respectively.

| cases | Pin (dBm) | VOA (dB) | SOA (dB) | IS (mA) | Pout (dBm) |
|---|---|---|---|---|---|
| a | −20 | 0 | 15 | 130 | −5 |
| b | −15 | 0 | 10 | 100 | −5 |
| c | −10 | −5 | 10 | 100 | −5 |
| d | −5 | −8 | 8 | 80 | −5 |
| e | 0 | −12 | 7 | 70 | −5 |
| f | 5 | −15 | 5 | 50 | −5 |
| g | 10 | −20 | 5 | 50 | −5 |

For instance, in the case a, where the power of the incident beam L1 is −20 dBm, the attenuation of the VOA 12 is set to be 0 dB, which means that no attenuation is caused in the VOA 12 and the optical power input to the SOA 13 is maintained in −20 dBm. For the SOA 13, the optical gain thereof is set to be 15 dB by supplying the bias current IS of 130 mA to the SOA 13, which means that the optical output of the output beam L2 becomes −5 dBm. For the case f, where the optical power of the incident beam L1 is 5 dBm, the VOA 12 in the attenuation thereof is set to be −15 dB and the power of the beam output from the VOA 12 and input to the SOA becomes −10 dBm. Under such a condition, the SOA 13 is supplied with the bias current of 50 mA, which sets the optical gain thereof to be 5 dB. Then, the optical power of the amplified beam L2 becomes also −5 dBm. Thus, the amplifying unit 1 of the present embodiment may be controlled such that the output power of the amplified beam L2 becomes −5 dBm by varying both of the attenuation of the VOA 12 and the optical gain of the SAO 13, especially, the SOA 13 is controlled in a range showing the substantial optical gain thereof.

The method of the present embodiment next detects the output power Pout of the amplified beam L2 by the optical detector 31 at step S6. The detected results are fed back to the controller 31 so as to maintain the optical power Pout of the amplified beam in a preset value at step S7.

Figure 8:
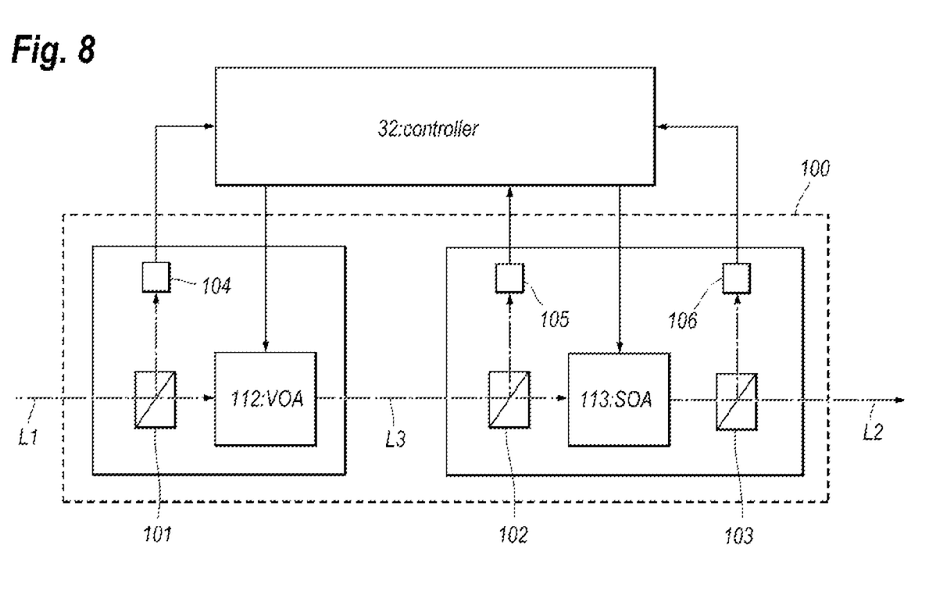
FIG. 8 is a functional block diagram of an optical amplifying unit comparable to the present invention.

The amplifying unit 1 and the method to control the unit 1 will be compared with a conventional arrangement of an amplifying unit 100 shown in FIG. 8. The conventional unit 100 discretely provides a VOA 112 and an SOA 113. Moreover, the conventional unit 100 provides optical detectors, 104 to 106, independent of the VOA 112 accompanying respective optical splitters, 101 to 103. The first optical detector 104 detects power of the incident optical beam L1 by splitting the beam L1 by the first optical splitter 101. The second optical detector 105 accompanying the second splitter 102 may detect optical power of the intermediate beam L3, which is attenuated by the VOA 112 and input to the SOA 113. The third optical detector 106 combined with the third splitter 103 detects the power of the amplified beam L2. The controller 32 controls the VA 112, the SOA 113, and three optical detectors, 104 to 106. Thus, although the function inherently attributed to the conventional amplifying unit 100 is same with those of the amplifying unit 1 of the present invention, the conventional unit 100 is likely to enlarge a size thereof.

On the other hand, the optical amplifying unit 1 of the present embodiment, the power of the incident optical beam L1 may be detected by the VOA 12 itself without implementing the first splitter 101 and the first optical detector 104, and the attenuation of the VOA 12 may be adjusted depending on thus detected power of the incident optical beam L1, and the amplified output beam L2 having desirable power Pout may be output from the SOA 13. An arrangement of the VOA 12 that determines the power Pin of the incident optical beam L1, in addition to a fact that the VOA 12 is monolithically integrated with the SOA 13, may form the amplifying unit 1 in compact. In the method thus described, the power Pout of the amplified optical beam L2 is fed back to the bias current IS supplied to the SOA 13 which may adjust the optical gain of the SOA 13 such that the power Pout is maintained in a preset desirable value.

The method of the present application may activate the SOA 13 by supplying the bias current IS thereto after the second bias V2 is provided to the VOA 12 to set the attenuation of the VOA 12 in an optimum value. Thus, the SOA 13 may be prevented from being saturated in the output thereof. When the amplified output beam L2 has excess power, an apparatus set in downstream of the amplifying unit 1 is sometimes fallen in failures. The sequence that the activation of the SOA 13 is subsequent to the set of the attenuation of the VOA 12 may effectively protect the apparatus set in downstream of the amplifier amplifying unit 1.

Also, the biases, V1 and V2, supplied to the VOA 12 are negative bias or zero bias, that is, the biases, V1 and V2, in most part thereof are applied in the attenuating layer 24 because the layers, 23, 25, and 26 putting the attenuating layer therebetween are sufficiently doped to lower the resistance thereof. Thus, the biases, V1 and V2, cause a strong electric field in the attenuating layer 24, which may induce a shift of the energy bandgap of the semiconductor material, and a change of the absorption co-efficient of the attenuation layer. Because of the substantial attenuation of the incident beam L1 in the VOA 12, the saturation of the SOA 13 may be effectively suppressed and the apparatus set in the downstream of the SOA 13 may be effectively protected from an excess optical power.

Also, the VOA may estimate the input power Pin of the incident beam L1 from the photocurrent IM generated therein by receiving the negative or zero bias V1. Obtaining a relation between the photocurrent IM and the input optical power Pin, for instance, as a memory look-up-table, in advance to practical operations of the optical amplifying unit, the amplifying unit may easily determine the optical input power Pin by referring to the table and the second bias condition V2 to adequately attenuate the incident optical beam L1.

Figure 5:
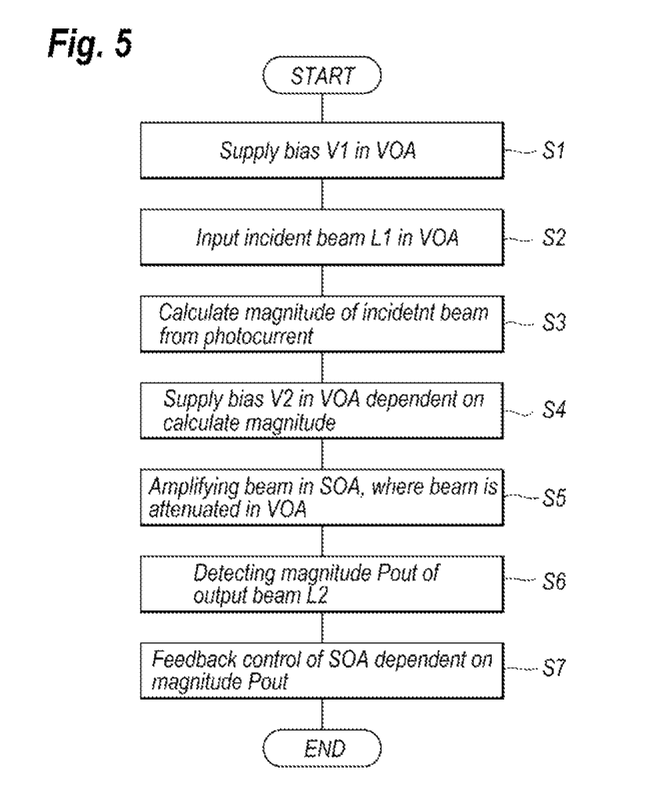
FIG. 5 is a flowchart of a method to control the optical amplifying unit shown in FIGS. 2 and 3.

Although the algorithm shown in FIG. 5 sets the bias current IS for the SOA 13 to be zero at step S1 for determining the input power Pin of the incident beam L1, the SOA may be supplied with a substantial bias current IS. Specifically, setting the optical amplifying unit 1 in a dark, and supplying a substantial bias current to the SOA 13, a current is caused in the VOA 12 as a dark current IM0. The photocurrent IM corresponding to the input power Pin of the incident beam L1 may be determined by subtracting the dark current IM0 from a current IM1 practically generated in the VOA 12 as receiving the incident beam L1 under and biasing the SOA 13 with the bias current.

The output power Pout of the output beam L2 is detected by an external photodetector 31 in the embodiment of the present invention. However, the optical receiver 3 set in downstream of the amplifying unit 1 may detect the power Pout, and feed the detected optical power back to the amplifying unit 1.

While particular embodiments of the present invention have been described herein for purposes of illustration, many modifications and changes will become apparent to those skilled in the art. For instance, steps S1 and S2 shown in FIG. 5 may be concurrently carried out. Accordingly, the appended claims are intended to encompass all such modifications and changes as fall within the true spirit and scope of this invention.

What is claimed is:

1. A method of controlling an optical amplifying unit that implements a semiconductor device integrating a semiconductor optical amplifier (SOA) with a variable optical attenuator (VOA) primarily made of semiconductor materials, the VOA providing an attenuating layer and a lower cladding layer, the SOA providing an amplifying layer and a lower cladding layer that is common with the lower cladding layer in the VOA, the method comprising steps of:
   supplying a first bias to the VOA, the VOA in the attenuation layer thereof being negatively or zero biased by the first bias;
   inputting an incident optical beam into the VOA, the input optical beam in a portion thereof being absorbed by the VOA;
   calculating input power of the incident optical beam through a photocurrent generated in the VOA and a look-up table that correlates the photocurrent with the input power;
   supplying a second bias to the VOA to adequately attenuate the incident optical beam depending on the input power calculated from the photocurrent caused by the first bias;

supplying a bias current to the SOA to set an optimum optical gain in the SOA depending on the input power, the bias current setting a substantial optical gain in the SOA;

determining output power of an output optical beam output from the SOA; and adjusting the bias current supplied to the SOA such that the output power is maintained in constant.

2. The method of claim 1,
wherein the step of supplying the bias current to the SOA is carried out after the step of supplying the second bias to the VOA.

3. The method of claim 1,
wherein the second bias is a negative bias that causes substantial attenuation in the VOA or a zero bias.

4. The method of claim 1,
wherein the step of supplying the first bias is carried out under a condition where the SOA is supplied with no bias current.

5. An optical apparatus, comprising:
a semiconductor device that integrates a semiconductor optical amplifier (SOA) with a variable optical attenuator (VOA) that is primarily made of semiconductor materials on a semiconductor substrate; and a controller that evaluates input power of an incident optical beam entering the VOA through a photocurrent generated in the VOA, and provides, depending on the input power, a bias to the VOA to attenuate the incident optical beam and a bias current thereby the SOA shows an optical gain, wherein the VOA provides an attenuating layer and a lower cladding layer and the SOA provides an amplifying layer and a lower cladding layer that is common with the lower cladding layer in the VOA.

6. The optical apparatus of claim 5,
further comprising a photodetector independent of the semiconductor device, the photodetector detecting output power of an output optical beam output from the SOA.

7. The optical apparatus of claim 6,
wherein the controller maintains the output power of the output optical beam in constant by adjusting the bias current supplied to the SOA based on the output power detected by the photodetector.

* * * * *

UNITED STATES PATENT AND TRADEMARK OFFICE
CERTIFICATE OF CORRECTION

PATENT NO. : 10,033,161 B2
APPLICATION NO. : 14/850698
DATED : July 24, 2018
INVENTOR(S) : Ryota Teranishi Page 1 of 1

It is certified that error appears in the above-identified patent and that said Letters Patent is hereby corrected as shown below:

In the Specification

- Column 7, Line 57, "downstream of the amplifier amplifying unit 1" should be -- downstream of the amplifying unit 1 --

In the Claims

- Claim 5, Column 10, Line 6, "a bias current thereby the SOA shows an optical gain" should be -- a bias current to the SOA, thereby the SOA shows an optical gain --

Signed and Sealed this
Thirteenth Day of November, 2018

Andrei Iancu
*Director of the United States Patent and Trademark Office*